United States Patent
Hashash

(10) Patent No.: US 7,356,449 B2
(45) Date of Patent: Apr. 8, 2008

(54) METHOD AND PROGRAM PRODUCT FOR SOLID MECHANICS MODELLING WORKBENCH AND DYNAMIC DISPLAY

(75) Inventor: Youssef Hashash, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 795 days.

(21) Appl. No.: 10/123,357

(22) Filed: Apr. 16, 2002

(65) Prior Publication Data

US 2003/0195725 A1 Oct. 16, 2003

(51) Int. Cl.
*G06G 7/48* (2006.01)
*G01D 1/16* (2006.01)

(52) U.S. Cl. .................. 703/7; 703/6; 73/789

(58) Field of Classification Search .............. 703/6, 703/7; 73/789
See application file for complete search history.

(56) References Cited

OTHER PUBLICATIONS

Abaqus User's Manual vol. 1; pp. 4.1.1-1 to 4.1.1-4; 4.1.2-1 to 4.1.2-4; 4.4.1-1 to 4.4.14-5; 1995.*

Thierry Delmarcelle and Lambertus Hesselink, Visualizing second-order tensor fields with hyperstreamlines, *IEEE Computer Graphics & Applications*, 13(4): 25-33, 1993.

Haber, R.B., Visualization techniques for engineering mechanics, *Computing Systems in Engineering*, 1(1): 37-50, 1990.

Helman, J.L. and L. Hesselink, Visualizing vector field topology in fluid flows, *IEEE Computer Graphics & Applications*, 11(3): 36:46, 1991.

Delmarcelle, T. and L. Hesselink, Visualization of second-order tensor fields and matrix data in *Proceedings of IEEE Visualization Conference '92, IEEE Computer Society Press*: 316-323, Los Alamitos, CA, Oct. 1-23, 1992.

Kriz, R.D., E.H. Glaessen, and J.D. MacRae, *eigenvalue-eigenvector glyphs: Visualizing zeroth, second, fourth and higher order tensors in a continuum*, in Workshop on modeling the development of residual stresses during thermoset composite curing, University of Illinois: Champaign-Urbana, 1995, no page #'s.

Ed Boring and Alex Pang, Directional flow visualization of vector fields, *IEEE* 1996, 389-392 & 506.

B. Jeremic, G. Scheuermann, J. Frey, Z. Yang, B. Hamman, K.I. Joy, H. Haggen, *Tensor visualizations in computational geomechanics*, University of California at Davis, Sep. 2001, pp. 1-30.

J. Ghaboussi, J.H. Garrett Jr., X. Wu, Knowledge-based modeling of material behavior with neural networks, *Journal of Engineering Mechanics*, vol. 117, No. 1, Jan. 1991, pp. 132-153.

Y.M.A. Hashash and A.J. Whittle, Integration of the modified cam-clay model in non-linear finite element analysis, *Computers and Geotechnics*, Elsevier Science Publishers Ltd, England, Great Britain, 1993, p. 59-83.

(Continued)

*Primary Examiner*—Hugh Jones
(74) *Attorney, Agent, or Firm*—Greer, Burns & Crain, Ltd

(57) ABSTRACT

An embodiment of a method and a program product of the invention has steps of selecting a model from a plurality of models in a model library, with at least one of the models being a constitutive model. Load data and load path data are input to the model to generate model output. The output is then displayed in a graphical format.

34 Claims, 15 Drawing Sheets

OTHER PUBLICATIONS

Jean H. Prevost and Radu Popescu, Constitutive relations for soil materials, *Electronic Journal of Geotechnical Engineering*, Nov. 1996, p. #'s ?

Dikeman, S.U. and J. Ghaboussi, Effective stress analysis of seismic response and liquefactions: theory. *Journal of Geotechnical Engineering*, 1984. 110(5): 628-644.

Hashash, Y.M.A. and AJ. Whittle, Integration of Modified Cam Clay model in non-linear finite element analysis. *Computers and Geotechnics*, 1992. 14(2): 59-83.

Hibbard, W. The VisAD Java Class Library Developers Guide. In *Alliance '98*. 1998. University of Illinois at Urbana-Champaign.

Ortiz, M. and E.P. Popov, Accuracy and stability of integration algorithms for elastoplastic constitutive relations. *International Journal for Numerical methods in Engineering*. 1985.21(9): 1561-1576.

Potts, D.M. and A. Gens, A critical assessment of methods of correcting for drift from the yield surface in elasto-plastic finite element analysis. *International Journal for Numerical and Analytical Methods in Geomechanics*, 1985.9(2): 149-159.

Roscoe, K.H. and J.B. Burland, On the generalized stress-straing behaviour of "wet".clay, in *Engineering Plasticity*, J. Heyman, Editor. 1968. 535-609.

Simo, J.C. and R.L. Taylor, A return mapping algorithm for plane stress elastoplasticity. *International Journal for Numerical Methods for Engineering*, 1986.22(3): 649-670.

Simo, J.C. and T.J.R. Hughes, General return mapping algorithms for rate-independent plasticity, in *Constitutive Laws for Engineering Material: Theory and Applications:* 1987.221-231.

"2000 Faculty Fellows Program Awardees, Internet Based Visualization for Constitutive Relations in Engineering, A generalized Learning and Development Tool-Youssef Hashash" published on the internet at http//www.ncsa.uiuc.edu/campusrelations/2000facultyfelllowsprogramawardees.html, circa 1999-2000.

\* cited by examiner (a) Constitutive model tab.

FIG. 3(b)

(b) Initial stress and strain tab.

(c) Laboratory/stress element visualization.

(d) Mohr circle representation of stress at principal stress state (1.0, 0.5, 0.3).

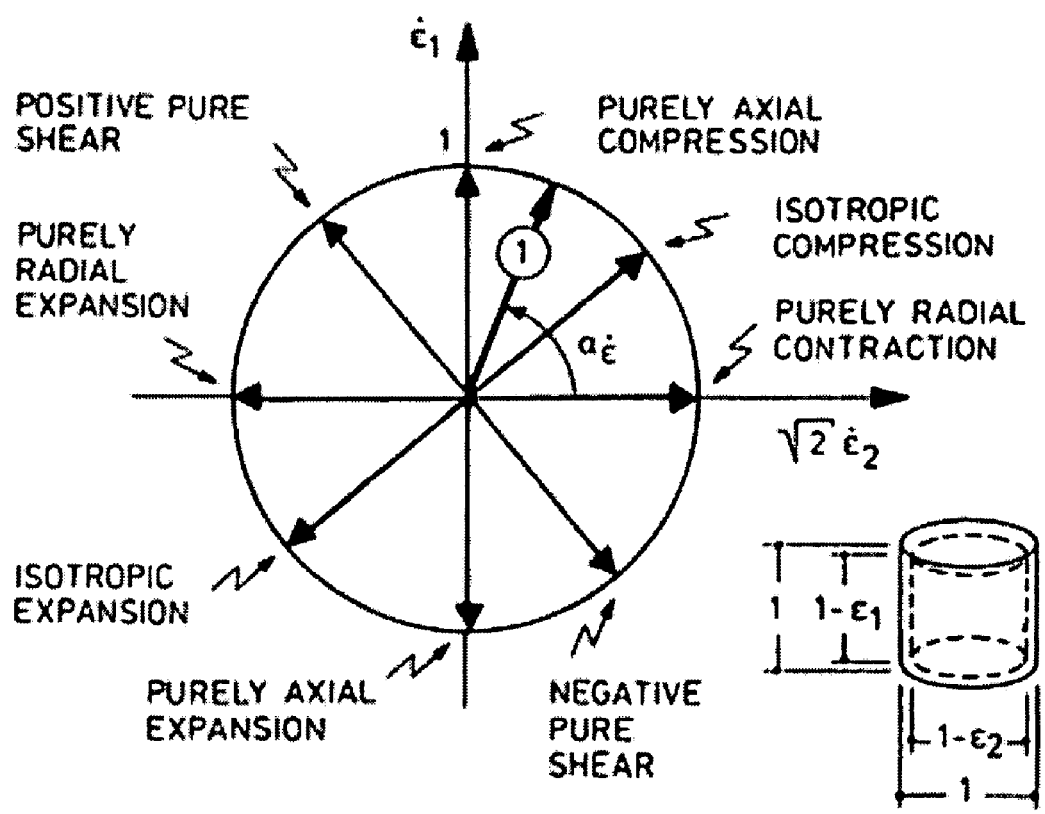
FIG. 4(a) Unit Strain Rates
(PRIOR ART)

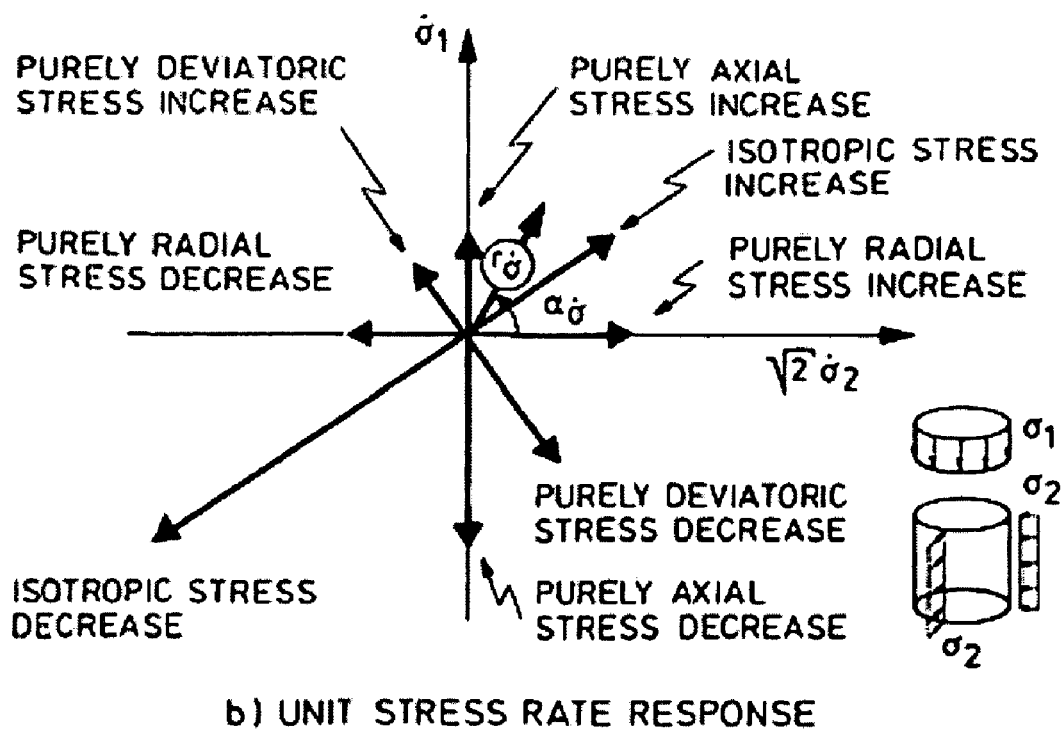
FIG. 4(b) Unit Stress Rate
(PRIOR ART)

FIG. 5(a) 2-D plot showing yield surface and stress path

FIG. 5(b) 3-D plot showing the stress path and failure cylinder in principal stress space. Normality of the associated flow rule illustrated with the arrow perpendicular to the yield surface at current plastic state.

FIG. 6(a) Glyph of initial principal stresses prior to shearing.

FIG. 6(b) Glyph showing the principal stresses after 20% axial strain.

FIG. 6(c) Mohr's circle representation of the state of stress in x-y plane after 20% axial strain.

METHOD AND PROGRAM PRODUCT FOR SOLID MECHANICS MODELLING WORKBENCH AND DYNAMIC DISPLAY

STATEMENT OF GOVERNMENT INTEREST

This invention was made with government assistance from the National Science Foundation under grant number CMS 99-84125. The government has certain rights in this invention.

FIELD OF THE INVENTION

A field of the invention is solid mechanics. Another field of the invention is methods and program products for solid mechanics modeling.

BACKGROUND OF THE INVENTION

Solid mechanics is concerned with the stress, deformation, and failure of solid materials and structures, and is useful for many end use applications. By way of example, engineering scientists in the fields of mechanical, structural, materials, civil, and aerospace engineering study solid mechanics. As a more particular example, the behavior of soil and rock under loads and stresses may be studied for purposes that may include engineering projects such as tunnels, open-cut excavations, foundation settlements, slope deformations, and embankment response.

Models are available for representing solid mechanics relations in a mathematical format. As a particular example, material constitutive relations and models are mathematical representations of the mechanical response of material relating stress to strain states as well as other aspects of material behavior including time dependent behavior such as heat flow, and creep. Constitutive models represent the material behavior at the point or "element" level and relate a second order symmetric stress tensor with six stress components to a second order strain tensor. One of the earliest and simplest constitutive models is Hook's Law, a mathematical relation that describes linear response of a spring being proportional to an applied force. Plasticity accounts for inelastic behavior by a yield criterion such as the Tresca and von Mises yield criteria to represent material failure. A flow rule determines material response at the yield surface. While these constitutive models are useful to establish a general framework for understanding material behavior, they may be inadequate for fully addressing complex behavior such as non-linearity, hardening and softening, anisotropy, and strain rate dependence.

Advanced models were therefore developed with versatile yield surfaces that expand to capture the maximum past stress experienced by the material and undergo rotation to simulate anisotropy. The Cam-Clay and the modified Cam-Clay models ("MCC") represent one of the earliest models widely used in geotechnical engineering to represent clay behavior and include an elliptical yield surface. Models were later developed with multiple yield surfaces and bounding surface plasticity. Other models can simulate the response of the soil under seismic condition. In these models soil is viewed as an assemblage of particles and can be used to capture localization.

In modeling a system to study solid mechanics, it may be helpful to consider more than one of the many models that are available. Indeed, different models may be useful for studying different relations, phenomenon, or the like of a particular system. Repeated modeling of the system using different models, however, can be a laborious task. It may require, for instance, locating a reference describing each model, coding a computer to apply the model, and studying the output of the model.

In addition to these problems associated with using multiple models to study a system, many solid mechanics models, with constitutive models as an example, are computationally intensive models that traditionally have been difficult to apply and understand even on an individual basis. Advances in computer hardware technology, however, have given a large cross-section of the engineering community access to inexpensive fast computers that substantially reduce the computational intensity of using the models. Users, some with limited background in numerical analysis techniques, can easily perform in a short period of time what used to be sophisticated lengthy analyses. The users of the complex models, however, need to have a fundamental understanding of the model and its influence on the engineering analysis.

Currently, it is difficult for new users of a complex solid mechanics model such as a constitutive model to develop an understanding of the model without spending significant time and effort in understanding the mathematical formulation, programming the equations, and then performing many simulations to examine the model performance.

Further, users of these complex models face difficulty in understanding and appreciating the model output. For example, constitutive relations are often described in terms of volumes and surfaces and represent quantities in a multidimensional space (e.g., six stress and strain components). The models may be displayed in a two-dimensional space (e.g., stress-strain plots), and may also be represented as a schematic of the volumes representing yield surface, plastic potential and failure surface. Users of constitutive models spend significant time and effort in developing a mental framework for understanding a given constitutive model, its output, and its implication on material behavior.

Unresolved problems in the art therefore remain.

SUMMARY OF THE INVENTION

The present invention is directed to methods and program products for modeling solids behavior. An embodiment of the present invention comprises a method for modeling solid mechanics comprising the steps of obtaining load and load path data to apply to the solids, inputting the data to a model selected from a plurality of models stored in a model library, at least one of the models comprising a constitutive model, the selected model generating model output data, and displaying the model output data in a graphical format.

In an example invention embodiment, the graphical format for displaying model output comprises a three dimensional display having a volume and a surface, and may comprises a glyph or a hyperstreamline. In an additional example invention embodiment, the model output is displayed dynamically wherein a change in the input load and/or load path data will result in a change in the displayed graphical format output.

The present invention solves many unresolved problems in the prior art. For example, an embodiment of the present invention provides an integrated framework and tool for users to explore the implications of different solids mechanics models and different load/load path data with output presented in a graphical format that aids understanding. In this manner, an embodiment of the present invention is directed to providing a workbench for performing solid mechanics modeling wherein a number of powerful modeling tools are conveniently available for application.

BRIEF DESCRIPTION OF THE DRAWINGS

FIGS. 3(a)-3(d) illustrate GUI images of an example invention program product embodiment.

FIGS. 4(a)-(d) are useful for illustrating probing of an invention embodiment.

DETAILED DESCRIPTION OF THE PREFERRED EMBODIMENTS

Before discussing invention embodiments in detail, it will be appreciated by those knowledgeable in the art that the present invention lends itself well to practice in the form of a computer program product as well as a method. Accordingly, it will be appreciated that embodiments of the present invention comprise computer program products comprising computer executable instructions stored in a computer readable medium that when executed cause the computer to perform certain steps. The steps performed may comprise steps of a method embodiment of the invention. It will be further appreciated, therefore, that discussion herein of the steps of an invention method embodiment may be applicable to an invention program product embodiment, and that description of a program product embodiment may be applicable to a method embodiment.

Figure 1:
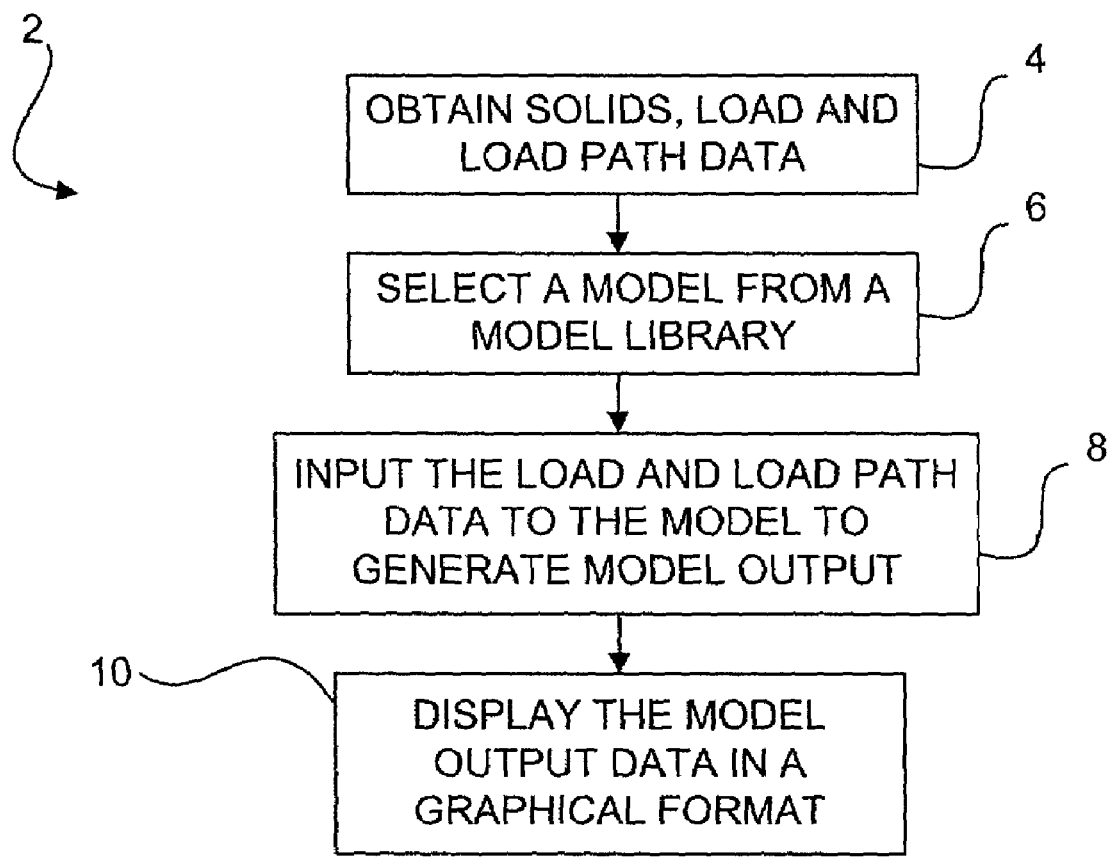
FIG. 1 is a flowchart illustrating a first example embodiment of the invention.

FIG. 1 illustrates an example embodiment 2 of a method and program product of the invention. Data describing the solids system to be modeled, load data, and load path data are first obtained (block 4). A model is then selected from a plurality of models, with at least one of the models comprising a constitutive model (block 6). The models may be contained in a model library. The solids, load, and load path data are then input to the selected model to generate model output (block 8). Finally, the model output is displayed using a graphical format (block 10).

Figure 2:
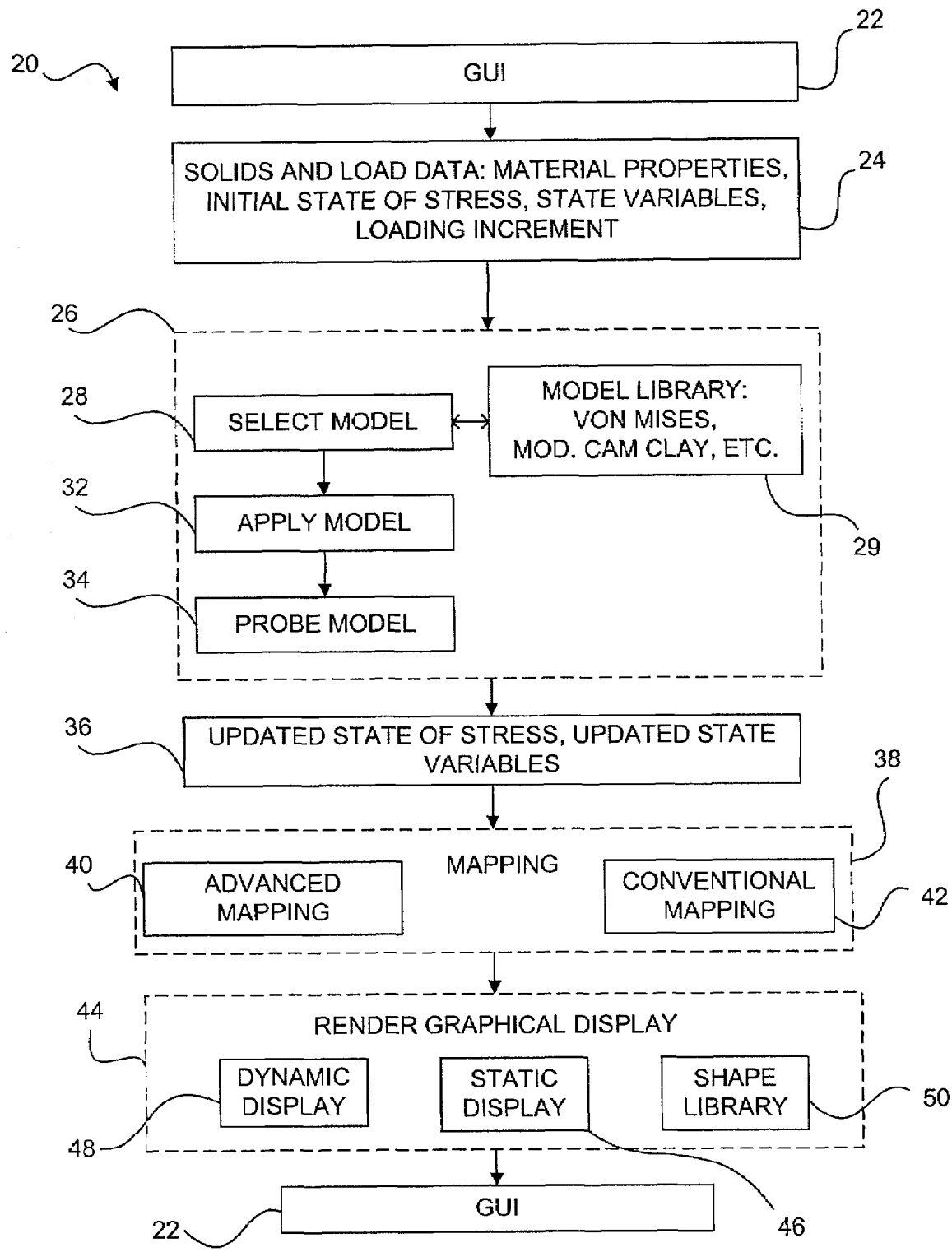
FIG. 2 is a flowchart illustrating a second example embodiment of the invention.

With this general example embodiment having now been presented, a more detailed embodiment may be described. Accordingly, reference is made to FIG. 2 to illustrating a second example embodiment of the present invention. In particular, FIG. 2 is a flowchart useful for illustrating an example computer program product and method embodiment 20 of the invention. The embodiment 20 comprises a graphic user interface (block 22) or "GUI" for interfacing with a user for receiving input data, displaying output data, and the like. Those knowledgeable in the art will appreciate that for the purposes of inputting data the GUI 22 may comprise any of a variety of forms, with an example comprising visually displayed symbols, characters, and the like on a screen or like display.

Through the GUI (block 22) the embodiment 20 may obtain input data (block 24) to be used for solid mechanics modeling such as a description of the solids system, load data, load path data, material property data, initial state of stress, state variables, loading increment, and the like. This data may be input by the user through manual data entry, through automated entry with menu selection items. In addition to being obtained through the GUI 22, some or all of this data may also be obtained through retrieval of existing data stored in a database or repository, on a portable medium, or on another like storage medium.

Figure 3A:
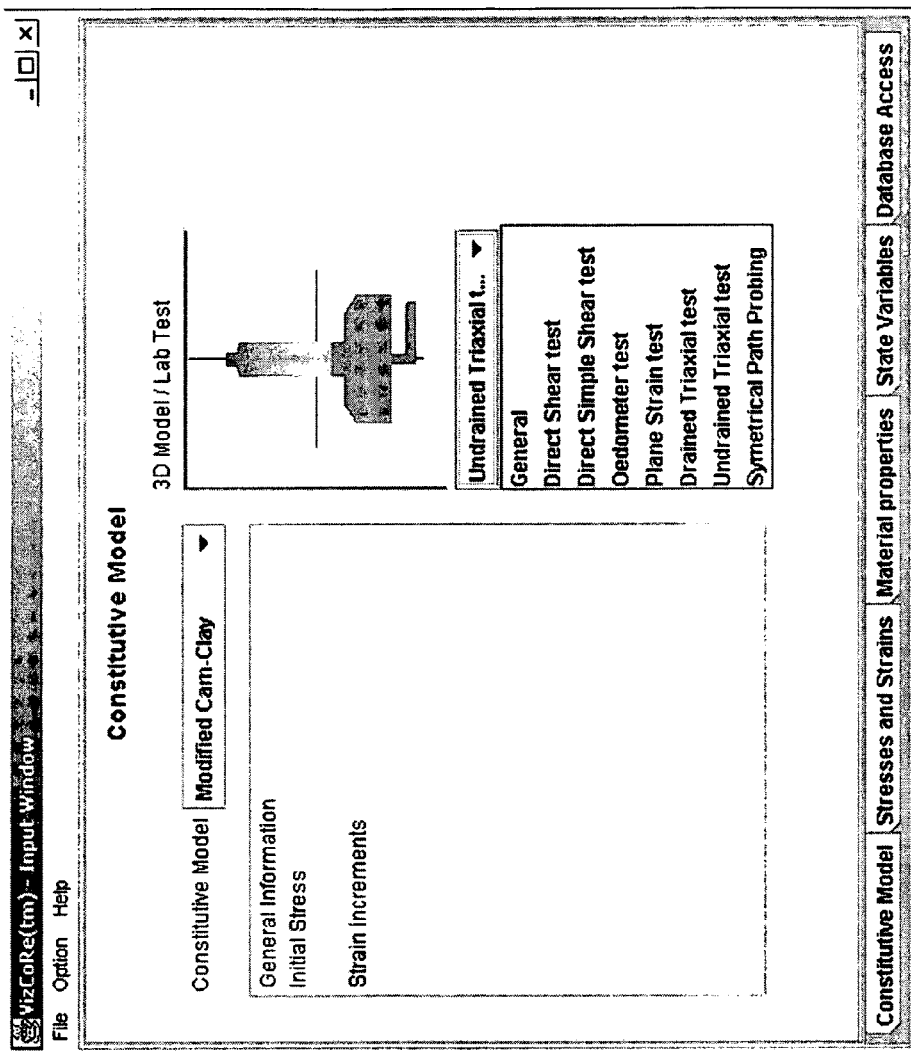
Figure 3B:
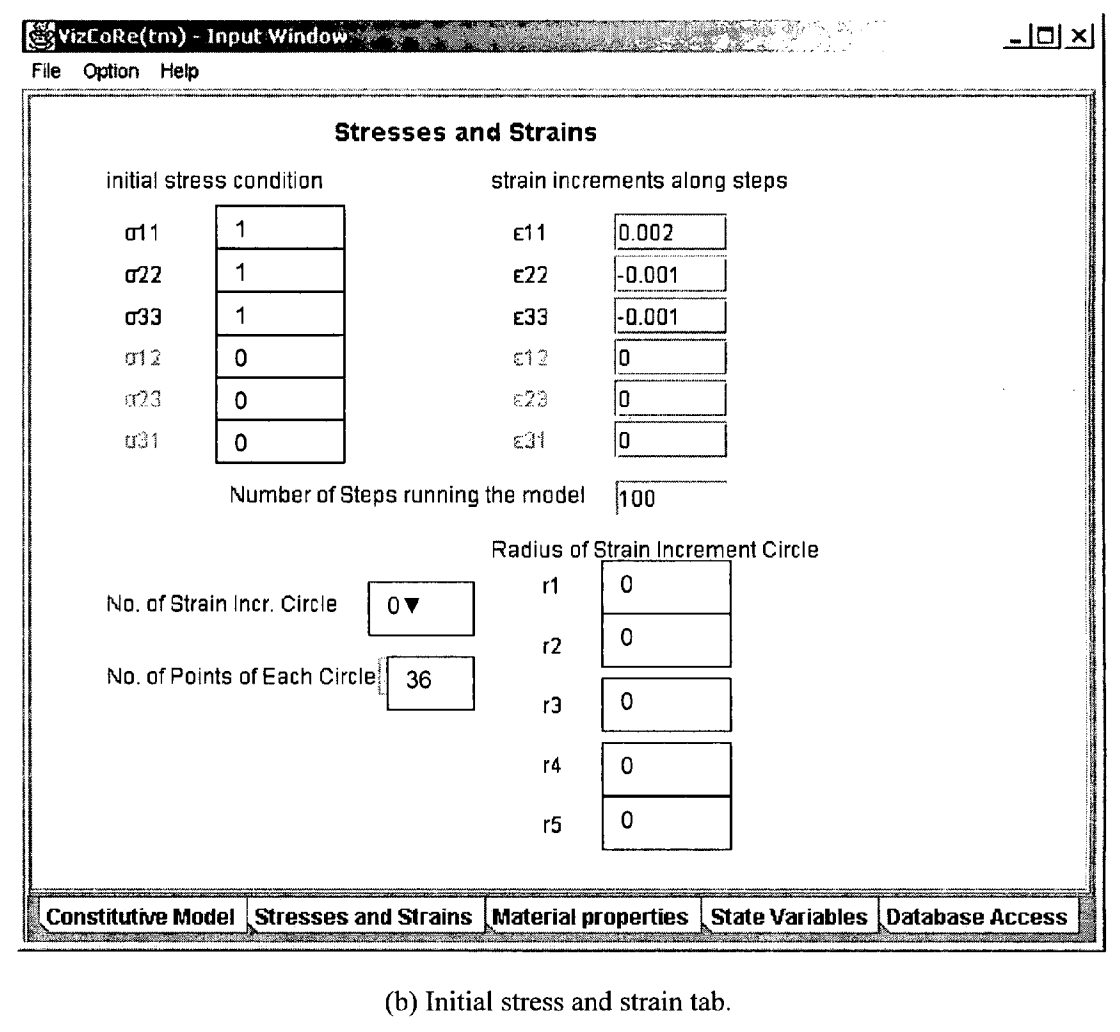

FIG. 3(a) illustrates an example GUI 22 screen for inputting data such as initial stress conditions and strain increments. As illustrated, the example GUI 22 screen comprises a plurality of fields for manually entering data. Other data input fields and options may be accessed through selection of other GUI screens using the tabs illustrated along the bottom of the screen of FIG. 3(a). For example, model material properties and initial values of state variables may be input through screens that come available through selection of their respective tabs. Also, choosing the tab labeled "Database Access" may provide access to input data stored in a database.

Load data generally comprises data describing the magnitude of the load or deformation, while load path data generally comprises data describing the geometric distortion or load of the application of the load to the system. Input or selection of load path data allows a user to examine material response when simulating standard laboratory testing paths including uniaxial compression and extension, triaxial compression and extension, and plane-strain compression and extension as well as general material response.

Referring again to FIG. 2, once the input data is obtained, it will be communicated to a modeling module (dashed line block 26). The modeling module (block 26) includes: selecting a model (block 28) from a model library (block 29), applying the model by inputting the data to the model to generate model output (block 30), and probing the model output (block 32).

The model library (block 29) preferably comprises a plurality of models, with at least one of the models comprising one or more constitutive models. Also, the model library may be accessible to users through the GUI or other means so that models may be added, modified, and/or deleted as desired over time. The availability of a plurality of models in one location for convenient application to the problem at hand is an advantage of the present invention. In a sense, the invention embodiment comprising a plurality of models to experiment with thereby provides a workbench for convenient use of different modeling tools.

Example constitutive models that may be stored in the model library for selection comprise the von Mises constitutive model, a Cam Clay constitutive model, a modified Cam Clay constitutive model, and the MIT-E3 constitutive model, Drucker Prager Plasticity Model, the Mohr-Coulumb Plasticity Model, the Cap Plasticity model, Classical and Hardening metal plasticity models, and the Oak Ridge National Laboratory Constitutive Model. Detailed teachings regarding these models are available in the art. It may be useful, however, to consider a brief summary of some of these models.

The von Mises model, also known as the distortional energy density criterion, generally holds that yield initiates when the distortional strain energy density becomes equal to the distortional strain energy density at some yield point. This yield point is defined as the undrained shear strength of the soil element modeled. The failure model also follows the associated flow rule (i.e., plastic deformation is normal to the yield surface). In principal stress space, the von Mises yield surface is cylindrical. Limitations to the use of the von Mises model for soil mechanics include 1) it is an over simplified one parameter model (undrained shear strength), 2) the shear strength is independent upon confining pressure, and 3) it predicts the same stresses in both compression and tension.

The Modified Cam Clay model, in general summary, is one of the most widely used effective stress soil models for non-linear finite element analysis of practical geotechnical problems and has been successfully applied to problems that involve loading on clay. The four main components of an elastic-plastic model are: 1) elastic properties, 2) plastic potential, 3) yield surface, 4) hardening rule, and 5) flow rule. For the Modified Cam Clay model, the yield surface is identical to the plastic potential and has the form of an ellipsoid in principal stress space. The plastic strains follow an associated flow rule, so the plastic potential gradient is equal to the yield surface gradient.

The MIT-E3 model is a bounding surface plasticity model that incorporates important features of soil behavior including a) anisotropic stress-strain-strength, b) small strain non-linearity, c) strain softening in certain modes of shear deformations, and d) hysteretic and inelastic behavior during soil unloading and reloading.

The model library of an invention embodiment may further comprise a neural network based model. The field of constitutive relations has recently been extended beyond classical plasticity theories to include neural network concepts. In general, it has been shown that neural network concepts can be extended to constitutive relations. Neural networks are "trained" using laboratory tests or other data to learn the material behavior. If the training data contains enough relevant information, the trained neural network can generalize material behavior to new loading cases.

Selection of the model from the library may be accomplished through the GUI 22. FIG. 3(a) illustrates an example GUI 22 screen for selecting a model. As illustrated by that FIG., a model field 110 allows a user to select a particular model, such as the Modified Cam Clay constitutive model. A laboratory test simulation field 112 allows for the user to select one of a plurality of laboratory test simulations to apply, with example simulations comprising, but not limited to, oedometer, plane strain, plain stress, direct shear, direct simple shear, drained triaxial, and undrained triaxial, in addition to general state of loading that is not represented by a laboratory test.

A general state of loading can be input manually or linked to output from an analysis performed using a finite element, finite difference, boundary element, meshless technique, or similar method. For example, an invention program product embodiment may comprise performing a finite element analysis on a body, and selecting an individual element of that body using a cursor or other selector at the conclusion of the analysis. The load path data associated with this element under the finite element analysis will then be used in applying the selected constitutive model.

A three dimensional display of the particular laboratory test object is displayed in a third field 114, which may be rotated or otherwise manipulated for user reference. Further, information regarding each model may be available to additionally inform the user as to the strengths, weaknesses, and differences between particular models.

Once selected, the input data (block 24) will be input to the model to generate model output data (block 32). It will be appreciated that the generation of output data generally comprises processing the input data according to the format and construct of the model. In general, the constitutive models are in a rate or differential form and have to be integrated to compute the material response over a given strain increment. At least two general classes of integration algorithms are used: explicit integration algorithms, and implicit integration algorithms. For example, the MCC model is integrated using an implicit integration algorithm using the "General Closest Point Projection Algorithm," as described in "Integration of Modified Cam Clay model in non-linear finite element analysis," Hashash et al., Computers and Geotechnics, 14(2): 59-83 (1992), incorporated herein by reference. For a given strain increment a trial stress state is estimated using an elastic predictor; if the state is located outside the yield surface a plastic corrector is computed. The plastic corrector imposes the flow and hardening rules together with the consistency requirement. The von Mises model may also be integrated using an implicit integration scheme, while the MIT-E3 is implemented using an explicit integration scheme.

The embodiment 20 further comprises a step of probing the model (block 34). As used herein, the term "probing the model" is intended to broadly refer to checking the model output data for performance. For example, the probing of the model may comprise verifying that the model as applied to the input data obeys basic laws of conservation in mechanics. In addition, the probing of a model may probe the predictive capability of the constitutive relation as well as its completeness. For example, the probing of a model may comprise verifying that energy or work is not extracted from a constitutive relation, and thus provides an indication of the stability of the model.

Figure 4C:
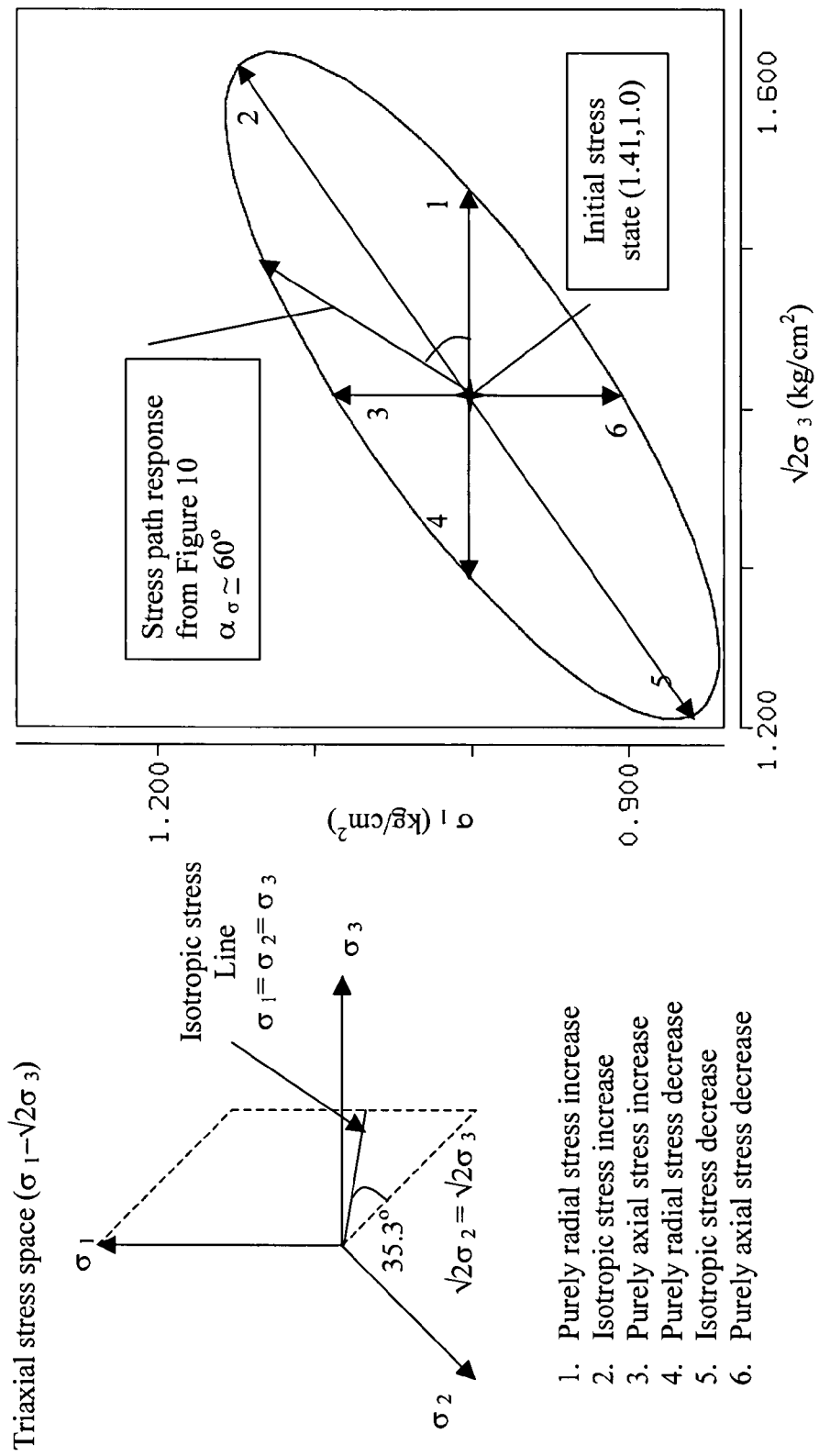
Figure 4D:
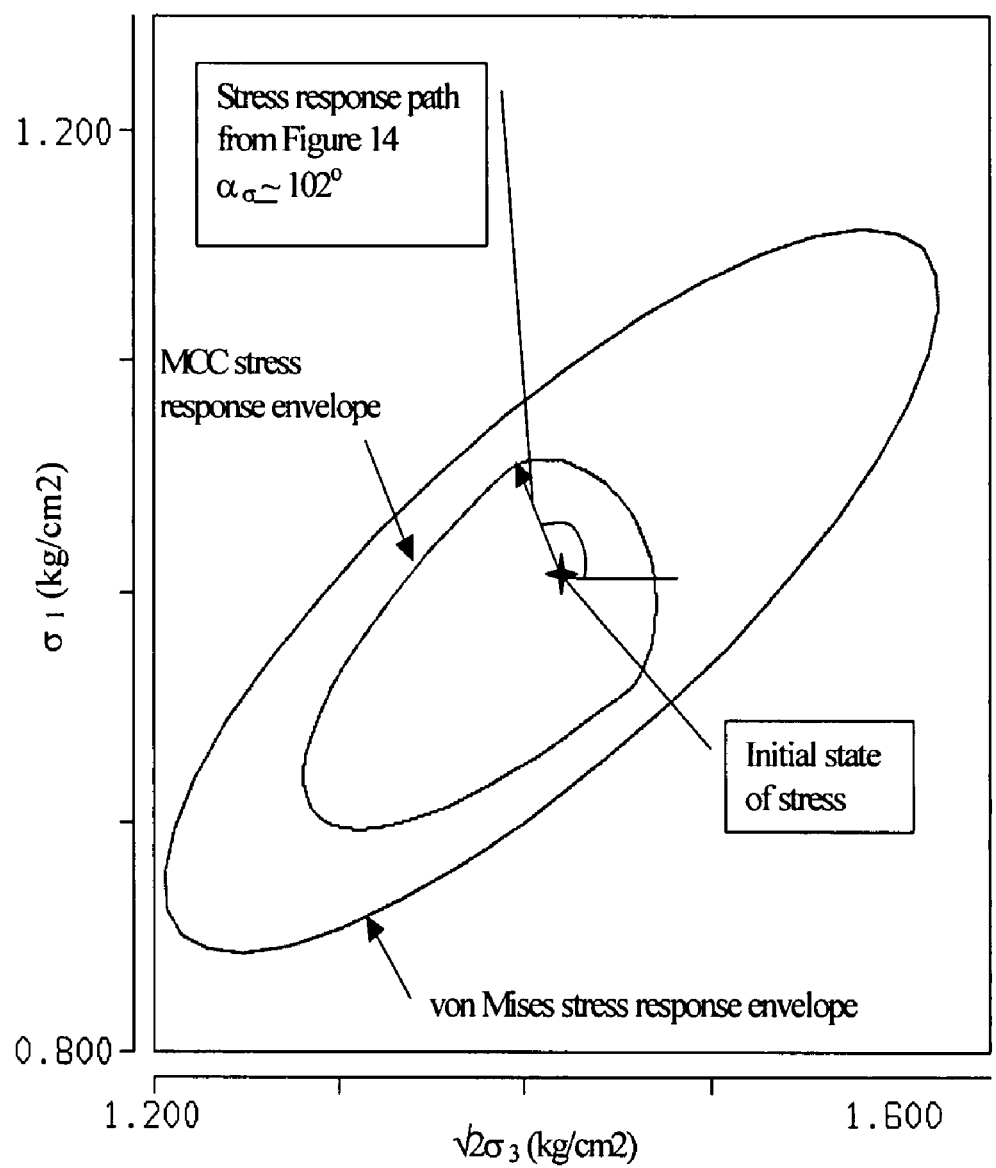

FIGS. 4(a)-(d) are useful for illustrating a probing method of an invention embodiment. In particular, FIGS. 4(a)-(b) are plots of the stress and strain response envelope of the MCC model using the Gudehus probing procedure with a strain circle strain rate radius of 0.1%. The MCC response can be compared to that of an example von Mises model response envelope shown in FIG. 4(c), which is superimposed on FIG. 4(d). Both models are probed from the same initial isotropic state of stress using equivalent Boston Blue Clay properties. The response for MCC is anisotropic, while the model has an isotropic yield surface; therefore the stress response envelope is asymmetric. The MCC model predicts a much softer soil response in compression than in extension.

Probing capabilities are a useful advantage of an embodiment of the present invention. As models, and particularly constitutive models, have become more complex, it is desirable to provide a check for general behavior and stability. In addition, the probing of a model (block 34) may prove useful for systematically comparing the predictive capability of models. For example, it may be determined that one model is preferred over a second after application through systematic probing that shows one model to be more stable than the other.

After applying and probing the model, model output data is obtained (block 36). Generally, the model output data comprises the results of calculations and representations made to the input data using the selected model. In summary, the model output generally comprises an updated state of stress and state variables. The model output data may also comprise flags or other logical data that define the yield, failure, and potential surfaces.

The embodiment 20 next comprises steps of mapping the model output data (block 38). Mapping may generally be thought of as providing a framework and bounds for visually representing the model output data. During mapping, the model output data is further processed for visual display in a graphical format. In the embodiment 20, mapping is provided according to an advanced (block 40) or a direct (block 42) scheme.

Steps of direct mapping (block 42) enable the mapping of selected stress and strain scalar values in two or three dimensions. Direct mapping is used to represent up to three components of stress, and can superimpose the constitutive model geometry over the stress paths in conventional space. Direct mapping can map:

- stress and strain response due to loading specified in the loading path module
- the yield surface, flow rule, and Mohr circle of stress
- in a two dimensional space, any pair of the 12 independent components of stress and strain. Other components can also be mapped such as step number, constitutive model state variables, and mean-deviatoric stress components.
- in three-dimensional space, any combination for the stress tensor and principal stress values, which can be mapped in principal stress space. This allows the stress path to be mapped in relation to the hydrostatic axis and n-line with superimposed constitutive model geometry.

Direct mapping for constitutive model output data, stress paths, and the like may be useful for simple loading cases such as uniaxial compression or extension or triaxial loading. However, under a general loading condition, or when examining the stress history result at a point from a finite element analysis, all stress and strain components carry relevant information about the loading history experienced. Advanced mapping (block 40) may be useful for such cases.

Advanced mapping techniques may comprise use of a glyph, a hyperstreamline, or other geometric shape to graphically represent second order symmetric stress tensors or similar representation techniques. Four or greater stress, strain, or state variables may be represented using advanced mapping. As an example, in these techniques problems associated with visualizing six independent components are resolved by representing three orthogonal unit vectors whose magnitude is equal to the eigenvalue of the second order tensor, and whose direction is defined by the corresponding eigenvector. Advanced mapping techniques such as use of glyph and glyph-like geometric shapes allow for data that describes six components to be represented using only a three dimensional shape. This may be accomplished by taking advantage of mapping and rendering densities, surfaces, and like details of the shape. An invention embodiment may comprise using advanced or direct mapping based on a user input selection. For example, the GUI 22 may provide an interface for a user to select one or more modes of mapping.

Following mapping, the embodiment 20 comprises rendering a graphical display of the mapped output data (block 44). Method and program product embodiments of the invention comprise rendering a static graphical display (block 46) or a dynamic display (block 48) of the model output data. The display may be presented in two or three dimensions, and may comprise animation. The static display component is primarily used to display two-dimensional data, but may also comprise three dimensions, including, for example, a volume and a surface In the invention embodiment 20, steps of rendering a dynamic graphical display (block 48) of the model comprise changing the graphical display in response to changes in the input or other data.

In this manner, a user may quickly and decisively examine the results of changes in load and/or load path data, for example. The display may be presented in a two or three dimensional rendering of loading paths and the model output data. For three-dimensional renderings, dynamic display allows the user to navigate through the space to view the model and view it from different angles as the stress path changes. Dynamic display also allows rotation and lateral movement within the display space.

The invention embodiment 20 further comprises a shape library 50 for use in rendering of a graphic display of the output data. The shape library 50 may comprise data for a variety of geometric shapes that may be used in models such as constitutive models, for instance. Shapes may include, but are not limited to, three dimensional shapes such as an arrow, cone, cube, sphere, cylinder, and the like. It has been discovered that use of pre-defined and pre-existing shapes from a library speeds the processing of embodiments of the present invention. The final output graphical display may be presented for user viewing using the GUI 22.

Figure 3C:
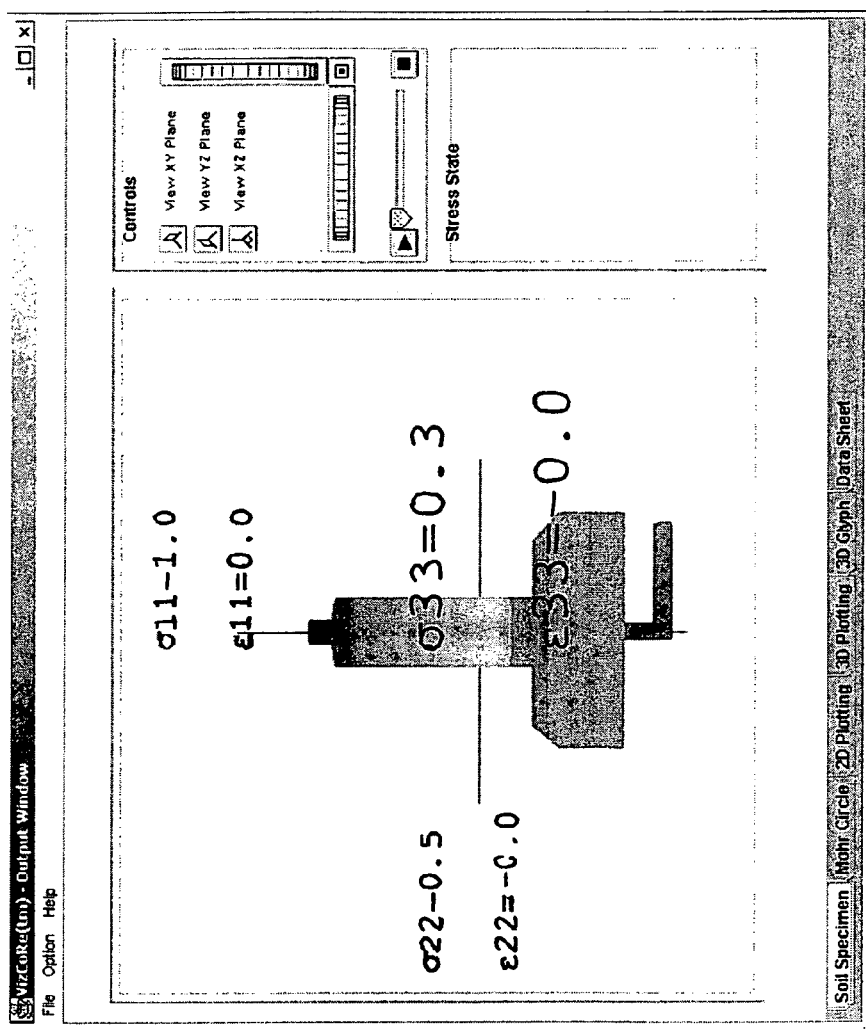
Figure 3D:
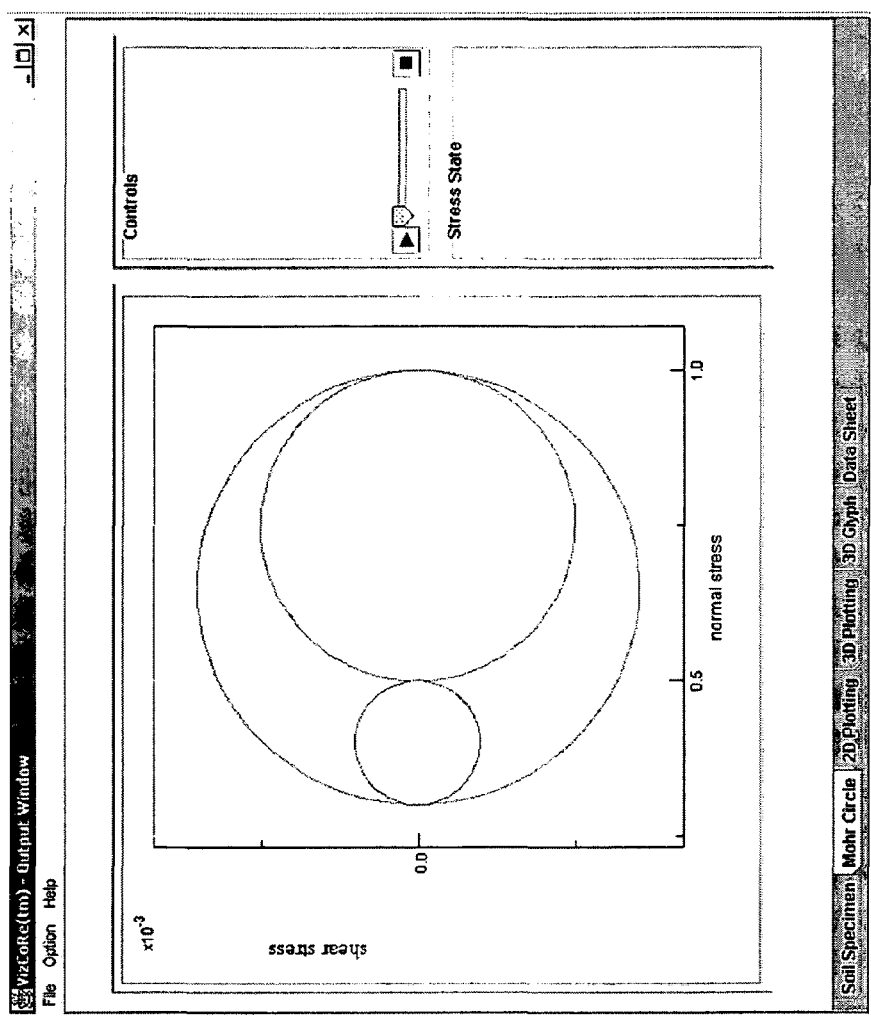

FIGS. 3(c) and (d) illustrate example output screens that may be comprised through a GUI 22 of the invention. As generally shown by FIG. 3(c), model output data can be illustrated in the form of a laboratory object 120 to visualize the deformation of the solids sample, such as a soil sample. A plurality of selectable controls 122 allow the user to alter the view of the object. Additionally, the output may be animated for viewing the object from different perspectives, following a load path, or like purposes. Output data may also be viewed on the screen in tabular form as shown by FIG. 3(c). FIG. 3(d) is an example GUI 22 screen illustrating a Mohr-circle representation of the initial stress state.

Figure 5A:
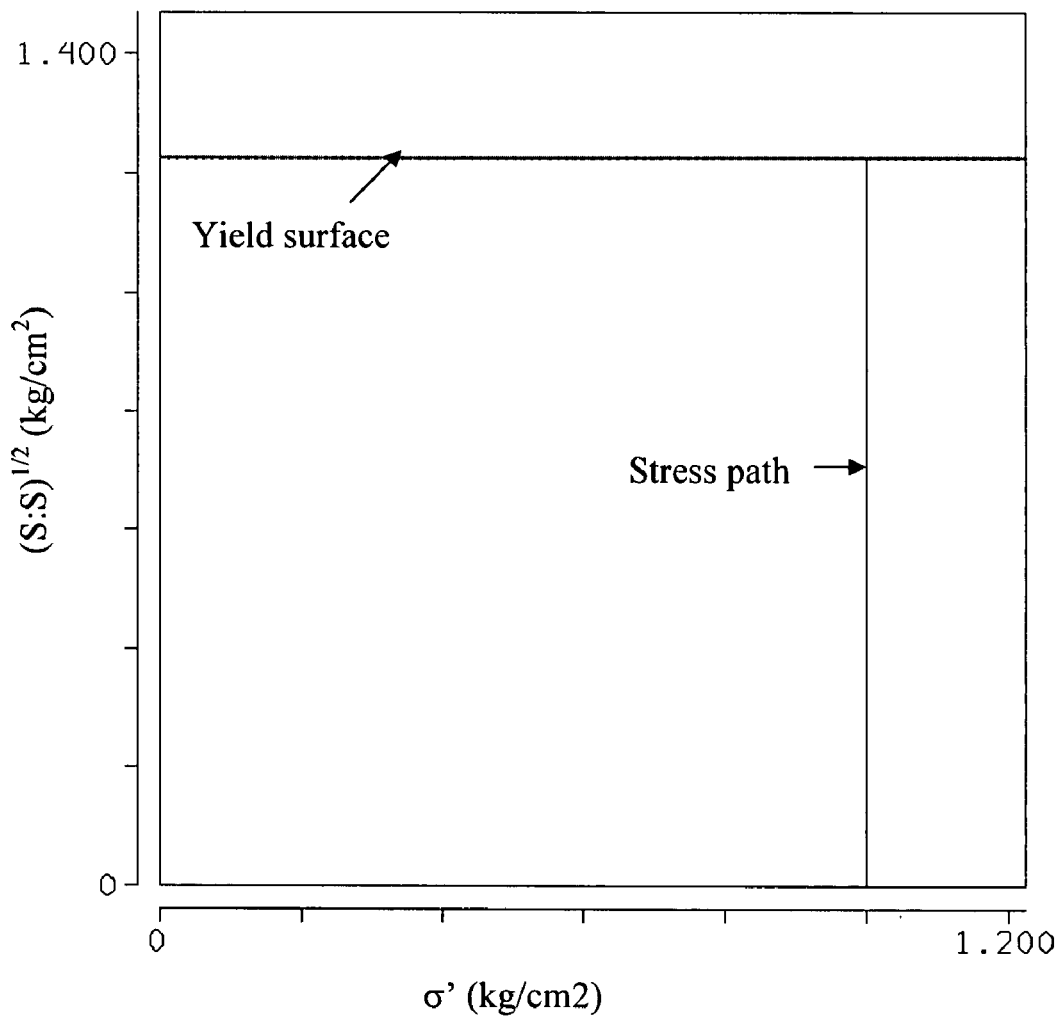
FIGS. 5(a)-(b) are useful for illustrating graphical display output of an invention embodiment.

FIGS. 5(a) and (b) are useful in illustrating graphical display capabilities of an example program product embodiment. FIG. 5(a) shows the two-dimensional stress path of an undrained triaxial compression shear test using the von-Mises constitutive model. The stress path is shown in distortional stress, $(S_i:S_i)^{1/2}$ versus mean effective stress σ' space. The stress measures used are:

Equation 1:

$$\sigma' = \frac{1}{3}(\sigma'_{11} + \sigma'_{22} + \sigma'_{33})$$

Equation 2:

$$(S_i:S_i)^{\frac{1}{2}} = \sqrt{\frac{1}{3}[(\sigma_{11}-\sigma_{22})^2 + (\sigma_{22}-\sigma_{33})^2 + (\sigma_{33}-\sigma_{11})^2] + 2(\sigma_{12}^2 + \sigma_{23}^2 + \sigma_{31}^2)}$$

For a triaxial test Equation 2 reduces to:

Equation 3:

$$(S_i:S_i)^{\frac{1}{2}} = \sqrt{\frac{2}{3}}(\sigma_{11} - \sigma_{22})$$

Figure 5B:
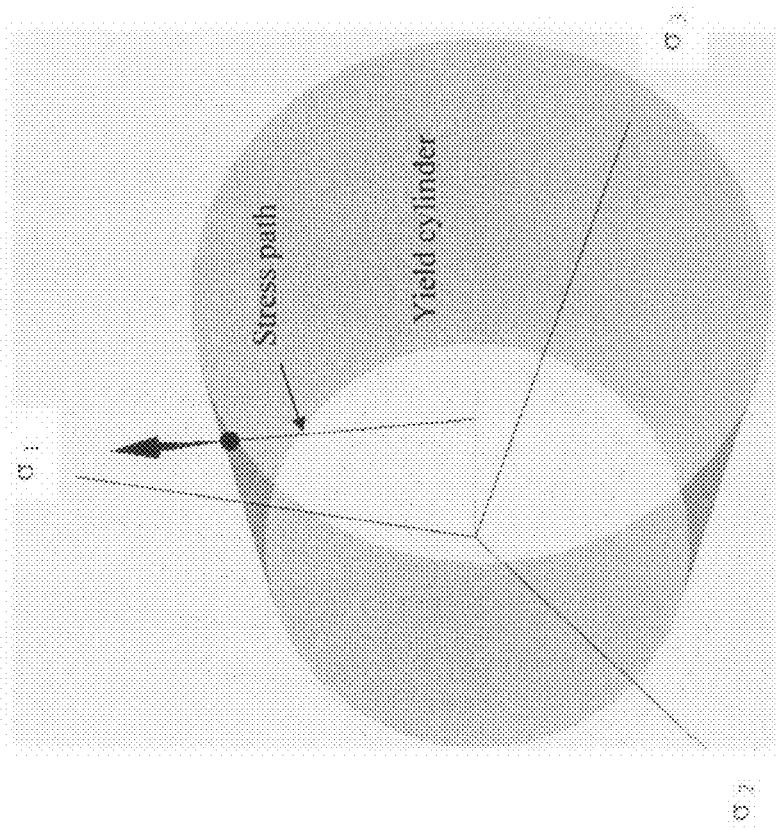

FIG. 5(b) shows the stress path in three-dimensional principal stress space in relation to the von-Mises yield surface.

The state of stress at the end of shearing is in a plastic state on the yield surface. The associated flow rule is shown as an arrow perpendicular to the cylinder that defines the yield surface. The display can be rotated, and the coloring and shading adjusted to give the user the ability to visually examine the stress path, the yield surface and the flow rule. This visualization technique gives the user a versatile tool for probing the constitutive model behavior of interest.

Figure 6A:
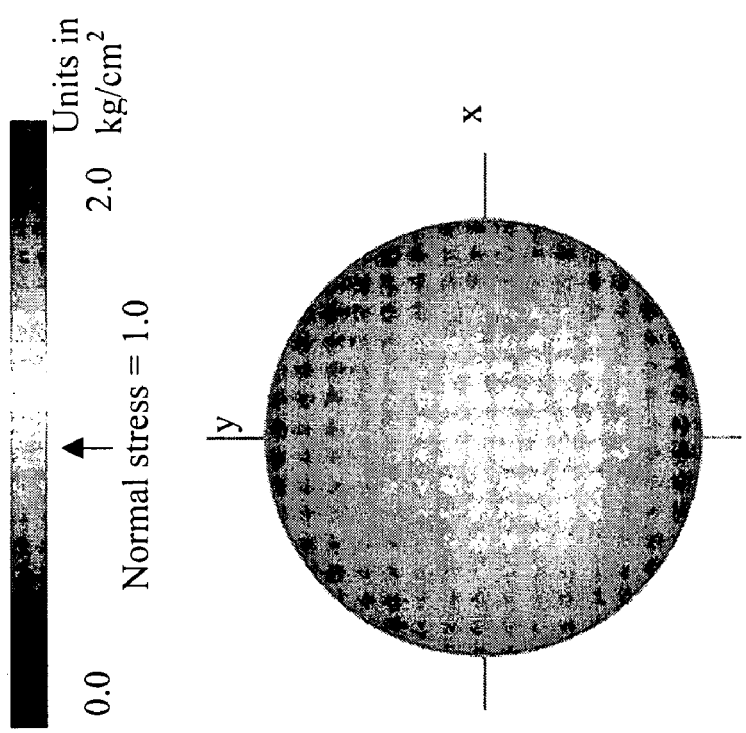
FIGS. 6(a)-(c) are useful for illustrating the use of glyphs within an invention embodiment.
Figure 6B:
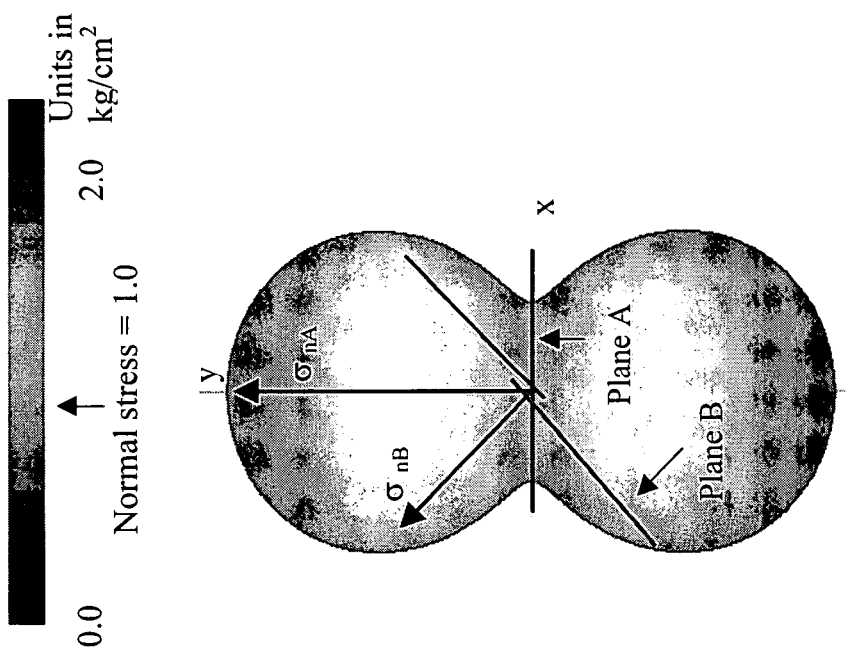
Figure 6C:
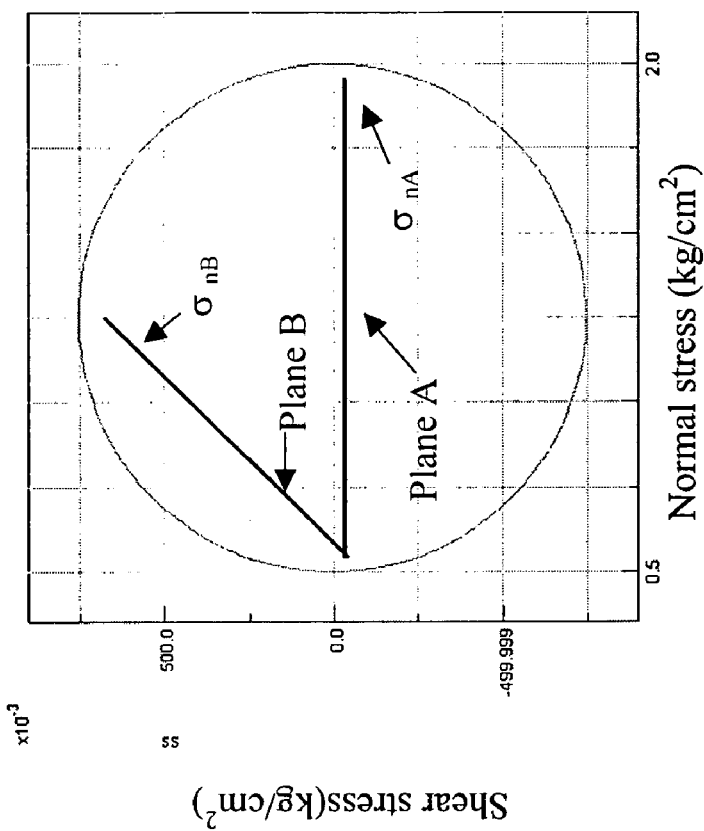

FIGS. 6(a)-(c) are useful for illustrating an invention embodiment's use of glyphs for graphically representing an undrained triaxial compression test using von Mises model. FIG. 6(a) is the Reynold's glyph representation of stress for the initial isotropic state of stress $[\sigma_1,\sigma_2,\sigma_3]=[1,1,1]$, and FIG. 6(b) illustrates the final state of stress after 20% axial strain. Although FIGS. 6(a) and (b) are illustrated in grayscale, it will be understood that an invention embodiment may comprise use of colors in representing output. FIG. 6(c) shows Mohr's circle representation of the state of stress in the x-y plane after 20% axial strain.

Still an additional embodiment of the invention comprises providing model output data in a graphical display that comprises a virtual reality format. As used herein, the term "virtual reality format" is intended to be broadly interpreted as comprising a manner of data display that provides output in addition to a visual data or graphics displayed on a single two-dimensional screen. By way of example, virtual reality output may comprise a three dimensional output displayed using virtual reality goggles worn by a user whereby the user may be able to "travel" into, around, and through a three dimensional image. The computer changes the displayed output in the goggles in response to movement of the user's head.

Other examples of virtual reality display may comprise a hologram displayed in space, a multi dimensional visual display such as a "cave" having a forward, left, right, upper, and lower screen, other multi-screen based displays, and the like. In these virtual reality output displays, the computer may change the output images as it detects movement of the user. For example, as the user moves about in the "cave" or moves about the hologram, the computer may change displayed images to give the user a virtual inspection and viewing experience. Invention embodiments may also provide for virtual reality output data that comprises force, with the output able to be physically "felt" through use of virtual reality gloves or the like whereby the surfaces and densities of a three dimensional model output shape may be felt. The computer program may, for instance, control resistance, pressure, tension and the like that are able to be felt as a user moves the glove about.

Still an additional component of virtual reality output that may be comprised in practice of an invention embodiment comprises sound. Volume, tone, pitch, type of sounds, and the like may be varied to represent different surfaces, densities, stress lines, yield points, failures, and the like. The sound data may be output over a plurality of speakers spatially separated from one another to represent different origin points for the data. These and other sound qualities may be varied and controlled by the computer as a user examines different portions of model output data. Sound data may be useful in combination with other data such as visual data or force. By way of example, virtual reality data could be output using virtual reality goggles, headphones, and a glove. As the user "moved" about to examine different portions of the data output, the computer could control output sent to the user through visual data, sound, and force.

The user's movements could be detected, for instance, using a joystick, a mouse, detectors connected to the user's body, a footpad, or other means.

Computer program product embodiments of the invention may also comprise communicating data over a network. By way of example, an Internet based computer program product of the invention may comprise communicating data to and from a user viewing the GUI 22 on a computer that is remote from and connected to one or more server computers on which the program product is running. Indeed, it will be appreciated that a network based invention embodiment may be desirable to provide widespread access to the program product. The network may comprise any suitable communications network, with examples including but not limited to the Internet, a WAN/LAN, a wireless network, a POT's network, and the like.

Computer program product embodiments of the invention may also comprise collaborative capabilities wherein a plurality of users may be able to work together in a single session using different computers. By way of example, different users at different computers connected over a network may be able to pass control of data input, model selection, and/or mapping/rendering amongst the users, while all of the plurality of users are able to view the GUI screens during a program session. This may be useful, for instance, for distance learning, remote consultation, or like applications.

In an example computer program product embodiment, the program product was implemented using Java. JAVA offers many advantages as it is a platform independent object-oriented programming language that allows for the development of standalone as well as web based applications. In addition, the Java platform has a built-in system of generating documentation (javadoc), separate from the code, that allows the user to document the structure of the workbench and document all classes, methods, and variables used. Those knowledgeable in the art will appreciate that other formats in addition to JAVA will be useful, with examples comprising C based languages such as C#, and Microsoft formats such as ".NET".

It will be understood that although computer program product embodiments of the invention have been discussed and described herein, that the present invention lends itself well to practice as a method. Indeed, the flowcharts of FIGS. 1 and 2 apply to method embodiments as well as program product embodiments.

It will be appreciated that although discussion and description herein has been made to particular invention embodiments, such discussion and description is made by way of example only. Those knowledgeable in the art will appreciate that the present invention is not limited to these embodiments. By way of example, it will be appreciated that although embodiments of the invention have been described herein as generally applied to modeling of soils, invention embodiments will also be useful for modeling of other structural and solid mechanics systems.

What is claimed is:

1. A program product for modeling solids mechanics, said program product comprising computer executable instructions stored in a computer readable medium that when executed by a computer cause the computer to:
    obtain load data to apply to the solids;
    obtain load path data to apply to the solids;
    select a model from a plurality of models stored in a model library, said plurality of models comprising at least a constitutive model;

input said load data and said load path data to said selected model to generate model output data; and, display said model output data in a three dimensional graphical format that comprises at least a yield surface, a plastic potential, and a failure surface rendered in three dimensions, through steps comprising:

mapping said model output data to a graphical format;

rendering said mapped graphical format to result in a surface and a volume illustrated in three dimensions;

rotating and laterally moving said surface; and, dynamically changing said surface and volume through animation in response to a change in one or more of said input load data or load path data.

2. A program product as defined by claim 1 wherein said plurality of models stored in said model library comprise at least two models selected from the group of models consisting of von Mises constitutive model, a Cam Clay constitutive model, a modified Cam Clay constitutive model, the MIT-E3 constitutive model, the Drucker Prager Plasticity model, the Mohr-Coulumb Plasticity model, the Cap Plasticity model, Classical and Hardening metal plasticity models, and the Oak Ridge National Laboratory Constitutive Model.

3. A program product as defined by claim 1 wherein said graphical format comprises one of a glyph or a hyperstreamline.

4. A program product as defined by claim 1 wherein the computer program instructions when executed cause the computer to display said model output data in said three dimensional graphical format using shapes selected from a shape library.

5. A program product as defined by claim 1 wherein said model output data and said graphical format comprises at least a second order stress tensor.

6. A program product as defined by claim 1 wherein said model output data and said graphical format comprise at least six independent stress components.

7. A program product as defined by claim 6 wherein said six stress components are displayed in said graphical format by representing three orthogonal unit vectors having a magnitude equal to the eigenvalue of the second order tensor.

8. A program product as defined by claim 1 wherein said load path data comprises data for simulating at least uniaxial compression and extension, triaxial compression and extension, oedometer compression and unloading, and plane strain compression and extension, plain stress compression and extension and general states of loading.

9. A program product as defined by claim 1 wherein the program instructions when executed by the computer further cause the computer to probe said model output by verifying that energy or work is not extracted from a constitutive relation thereby providing an indication of the stability of the model.

10. A program product as defined by claim 1 wherein the computer readable instructions when executed by the computer further cause the computer to:

select a visualization mapping from a plurality of mappings for use in displaying said model output data in said graphical format, said plurality of mappings comprising at least a direct mapping and an advanced mapping, wherein said direct mapping comprises a representation of three or fewer stress, strain or state variables, and wherein said advanced mapping comprises a representation of greater than 3 stress, strain or state variables.

11. A program product for modeling solids behavior as defined by claim 1, wherein the program instructions when executed further cause the computer to provide solids properties data for use by said model, and wherein said load data and said load path data comprise at least an initial state of stress, state variables, and a loading increment, and wherein said model output data comprises at least an updated stress, updated strain and updated state variables.

12. A program product for modeling solids behavior as defined by claim 1, wherein said load path data comprises linear or non-linear data.

13. A program product for modeling solids behavior as defined by claim 1 wherein the computer readable instructions when executed cause the computer to provide a graphical user interface for accepting input from a user and for displaying output to said user.

14. A program product for modeling solids behavior as defined by claim 1 wherein the computer readable instructions when executed cause the computer to communicate over a communications network whereby operation of the program product may be conducted remotely.

15. A program product as defined by claim 14 wherein the program instructions when executed further cause the computer to communicate with a plurality of simultaneous users over said network, wherein said plurality of users may collaborate with one another to input said data, select said model, and control said graphical display model output data.

16. A program product as defined by claim 1 wherein said graphical output comprises virtual reality output.

17. A program product as defined by claim 16 wherein said virtual reality output comprises graphical images displayed on a plurality of screens and sound data output through a plurality of speakers, and wherein the computer program instructions cause the computer to change said graphical images and said sound data in response to movements of a user.

18. A program product as defined by claim 1 wherein at least a portion of said load data and said load path data are stored in a database.

19. A program product as defined by claim 1 wherein at least one of said plurality of models in said model library comprises a neural network constitutive model.

20. A program product as defined by claim 1 wherein the program instructions when executed further cause the computer to obtain load path data generated as analysis output using one of a finite element or a finite difference analysis.

21. A program product as defined by claim 1, wherein the program in causing the computer to select a model from a plurality of models stored in a library further causes the computer to apply a laboratory test simulation using said model to a shape selected from a stored shape library, said library including at least a cylinder, a sphere and a cone, and wherein said model output data includes a three dimensional rendering of said shape which can be rotated and moved laterally through animation, said model output data further comprising coloring and shading adjusted to indicate one or more of a stress path and a yield surface.

22. A computer program product for modeling solid mechanics behavior, the program product comprising computer readable instructions stored in a computer readable medium that when executed by a computer cause the computer to:

provide a graphical user interface for accepting user input from a user and displaying output;

obtain load data and load path data;

input said load data and said load path data to a constitutive model, said model selected from a plurality of models stored in a model library, said selection based on said user input accepted through said graphical user interface;

generate model output data;

probe said model; and, dynamically display said model output data using a three dimensional graph including a rendered three dimensional object, said dynamic display providing for said three dimensional object to dynamically respond to user commands input through said graphical user interface whereby a change in said load data or said load path will cause said rendered three dimensional object to laterally and rotationally move through animation.

23. A program product as defined by claim 22 wherein said three dimensional graph comprises one of either a glyph or a hyperstreamline.

24. A program product as defined by claim 22 wherein the computer program instructions when executed further cause the computer to:

accept mapping selection input from a user through said graphical user interface, said mapping selection input determining whether a direct mapping or an advanced mapping are used in processing said model output data for said graphical display, wherein said direct mapping represents three or fewer components of stress, strain, or state variables and said advanced mapping represents greater than three components of stress, strain, or state variables.

25. A computer program product for dynamically modeling solid mechanics, the program product comprising computer executable instructions stored in a computer readable medium, the instructions when executed causing the computer to:

obtain load data to apply to the solids;

obtain load path data to apply to the solids;

input said load data and said load path data to a constitutive model to generate model output data; and, display said model output data in a dynamic graphical format that includes a rendered three dimensional object and whereby a change in said input load data or said input load path data will cause a change in said graphical format output, said dynamic graphical format allowing for rotation and lateral movement of said rendered three dimensional object as a stress path changes.

26. A program product as defined by claim 25 wherein said dynamic graphical format comprises a three dimensional graph comprising one of either a glyph or a hyperstreamline.

27. A program product as defined by claim 25 wherein said dynamic graphical format comprises a virtual reality format output, and wherein the program instructions cause the computer to change said virtual reality format output in response to movement of a user.

28. A program product as defined by claim 25 wherein said constitutive model comprises at least one model selected from a group of models stored in a model library, said group of models including at least a von Mises constitutive model, a Cam Clay constitutive model, a modified Cam Clay constitutive model, the MIT-E3 constitutive model, the Drucker Prager Plasticity model, the Mohr-Coulumb Plasticity model, the Cap Plasticity model, Classical and Hardening metal plasticity models, and the Oak Ridge National Laboratory Constitutive Model.

29. A program product as defined by claim 25 wherein the computer readable instructions when executed by the computer further cause the computer to:

select a visualization mapping from a plurality of mappings to use in displaying said model output data in said graphical format, said plurality of mappings comprising at least a direct mapping and an advanced mapping, wherein said direct mapping comprises a representation of three stress, strain, or state variable quantities, and wherein said advanced mapping comprises a representation of six stress, strain, or state variable quantities.

30. A program product as defined by claim 25 wherein said load path data comprises analysis output from a finite element analysis or a finite difference analysis.

31. A method for modeling solids mechanics comprising the steps of:

selecting a model from a plurality of models, said plurality of models comprising at least a constitutive model;

inputting load data and load path data to said selected model to obtain model output data; and, displaying said model output data in a dynamic graphical format wherein changing either of said input load or load path data will cause said graphical format output data to change, said graphical display rendering an object in three dimensions and providing lateral movement, rotation and viewing of said three dimensional object from different angles as a stress path changes, said three dimensional object dynamically changing through animation.

32. A method as defined by claim 31 wherein said dynamic graphical format comprises a three dimensional graph comprising one of either a glyph or a hyperstreamline.

33. A method as defined by claim 31 wherein the method further comprises the steps of:

selecting a visualization mapping from a plurality of mappings to use in displaying said model output data in said graphical format, said plurality of mappings comprising at least a direct mapping and an advanced mapping, wherein said direct mapping comprises a representation of three or fewer stress, strain, or state variable quantities, and wherein said advanced mapping comprises a representation of four or more stress, strain, or state variable quantities.

34. A method as defined by claim 31 wherein said dynamic graphical format comprises a virtual reality output comprising visual graphical data, sound data, and force data.

* * * * *